United States Patent [19]

Etchison, Jr. et al.

[11] 4,353,469
[45] Oct. 12, 1982

[54] SUPPORT SHELF FOR PRINTED CIRCUIT BOARDS

[75] Inventors: John O. Etchison, Jr., Clemmons; Robert H. W. Jones, Jr., Greensboro, both of N.C.

[73] Assignees: Western Electric Co., Inc.; Bell Telephone Laboratories, Inc., both of New York, N.Y.

[21] Appl. No.: 137,330

[22] Filed: Apr. 4, 1980

[51] Int. Cl.³ ............................................. H05K 7/18
[52] U.S. Cl. ..................................... 211/41; 361/415
[58] Field of Search .......................... 211/41; 361/415; 113/116 P

[56] References Cited

U.S. PATENT DOCUMENTS

| | | | |
|---|---|---|---|
| 3,015,755 | 1/1962 | Wright et al. | 361/415 |
| 3,349,924 | 10/1967 | Maurer et al. | 211/41 |
| 3,377,515 | 4/1968 | Erb | 361/415 |
| 3,382,476 | 5/1968 | Novet | 361/415 X |
| 3,458,767 | 7/1969 | Hedger et al. | 361/415 |
| 3,731,157 | 5/1973 | Reimer | 361/415 |
| 3,733,523 | 5/1973 | Reynolds et al. | 361/415 |
| 3,762,574 | 10/1973 | Bentley et al. | 361/415 X |
| 4,184,599 | 1/1980 | Drake et al. | 361/415 X |

OTHER PUBLICATIONS

RCA Technical Notes, "Printed Circuit Board Guide Assembly", Sep. 17, 1973.

Primary Examiner—Roy D. Frazier
Assistant Examiner—Robert W. Gibson, Jr.
Attorney, Agent, or Firm—D. D. Bosben

[57] ABSTRACT

A support shelf (12) having high strength and of unitary sheet metal construction, for supporting a plurality of closely-spaced printed circuit boards (28 and 29) and aligning the boards with respect to closely-spaced upper and lower connector plugs (24 and 26) of a backplane assembly (22) includes spaced front and rear support sections (40 and 42) and spaced front and rear guide sections (60 and 66). Upper guide channels (44) formed in the front and rear support sections (40 and 42) for receiving lower edges (46) of the printed circuit boards (28) supported on the shelf (12), and lower guide channels (62) formed in the front and rear guide sections (60 and 66) for receiving upper edges (30) of the printed circuit boards (29) supported on a lower shelf 14, have smooth board engaging surfaces (79 and 86) and flared end sections (78 and 84), to facilitate insertion and retraction of the boards (28 and 29) into and out of the connector plugs (24 and 26) of the backplane assembly (22) without scratching or marring the surface of the boards. The spacing between the front and rear support sections (40 and 42) and the front and rear guide sections (60 and 66) create a "chimney effect" when the shelves (12) are mounted in a transmission bay to facilitate air circulation between and cooling of the closely-spaced printed circuit boards (28 and 29).

7 Claims, 12 Drawing Figures

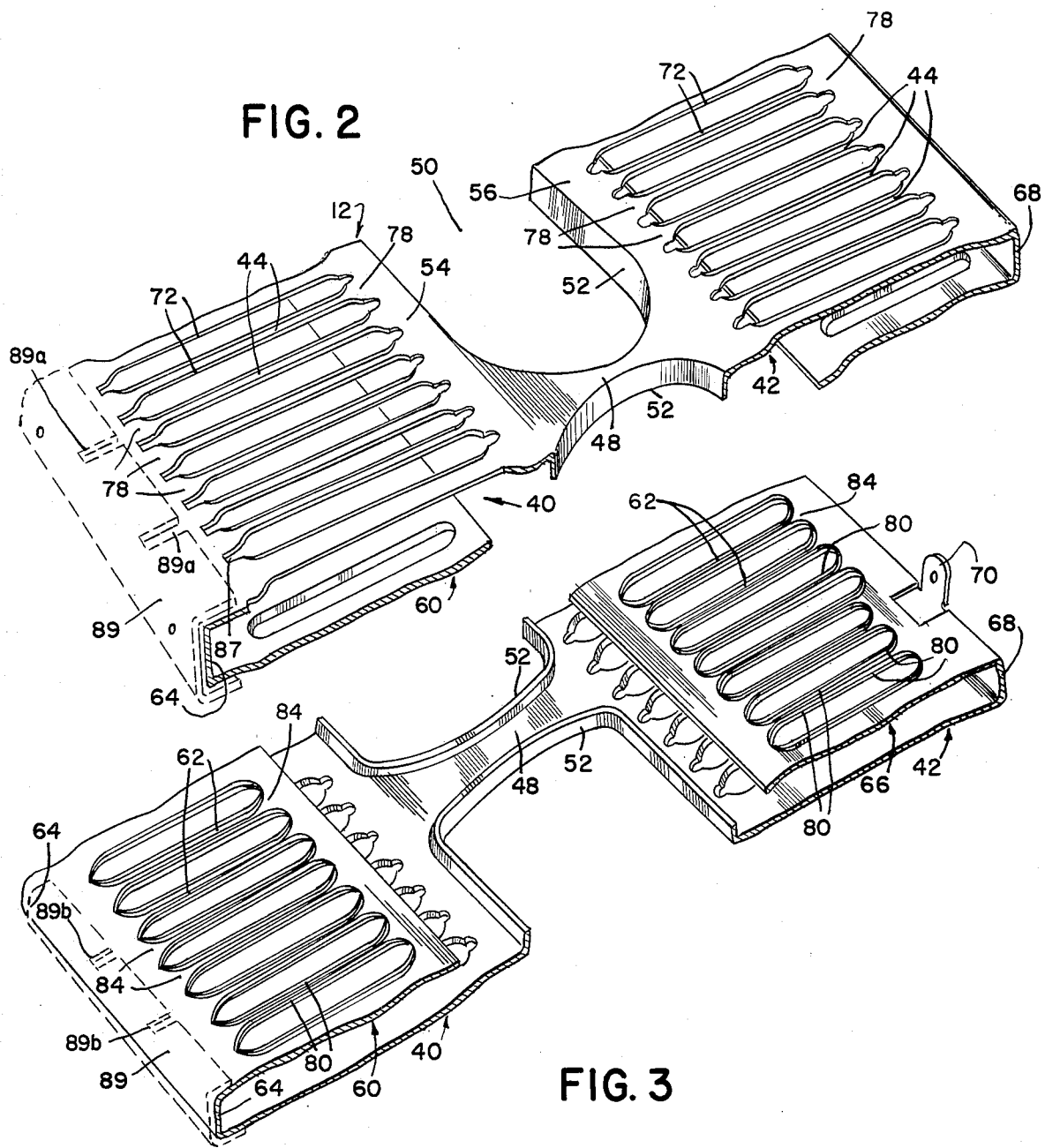

SUPPORT SHELF FOR PRINTED CIRCUIT BOARDS

TECHNICAL FIELD

This invention relates to support shelves for supporting printed circuit boards and the like, and particularly to support shelves of high strength for supporting a plurality of closely spaced plug-in printed circuit boards and aligning the boards with respect to closely spaced connector plugs of a backplane assembly.

BACKGROUND OF THE INVENTION

In the assembly of various types of electronic apparatus, such as communication transmission equipment, a plurality of printed circuit boards are plugged into connector plugs of a backplane assembly for interconnection of the boards to other electronic apparatus. In order to facilitate the insertion of plug-in portions of the boards into the connector plugs, support shelves are provided for supporting the boards and for aligning the boards with the connector plugs. Typically, a plurality of support shelves are horizontally mounted on a vertical bay frame in a spaced relationship from each other and include guide tracks or channels formed on upper and lower surfaces of the shelves. The upper guide tracks of one shelf cooperate with the lower guide tracks of an adjacent shelf to slidably receive lower and upper edges of the printed circuit boards, respectively. In this manner, the support shelves provide support for the printed circuit boards, proper alignment of the boards relative to the connector plugs of the backplane assembly, and orderly connection of the boards to the connector plugs.

As the electronics of transmission equipment becomes more and more complex, epoxy-coated metal printed circuit boards in relatively closely-spaced relationship (e.g., ½ inch centers) are being used to replace previously used epoxy-coated fiber boards. Accordingly, it is particularly important that the edges of the guide tracks and all other board-engaging surfaces of the shelves are smooth and free from burrs and sharp corners to avoid damage to the metal board coating. Otherwise, scratching or marring of the epoxy insulating surfaces of the metal boards could occur as the boards are being inserted into the backplane assembly, which could cause shorting or other malfunction of the boards during the operation of the transmission equipment. Further, scratching through the epoxy insulating coating of the printed circuit board to the underlying metal surface also can cause oxidation of the metal board where the scratch occurs, with subsequent deterioration of the board and flaking of the epoxy coating.

Additionally, the closely-spaced relationship of the metal printed circuit boards produces a weight concentration of equipment in a relatively small space. Consequently, the shelf must possess high strength characteristics and be highly resistive to flexing and bending when the plurality of printed circuit boards are supported thereon.

During the operation of the transmission bay module, the closely-spaced printed circuit boards supported on the shelves also generate a great deal of heat which must be dissipated from the shelves to insure continued uninterrupted operation of the printed circuit boards. Accordingly, it is desirable to provide support shelves which promote air circulation between the printed circuit boards and facilitate heat dissipation from the transmission bay module.

Further, occasionally a warped printed circuit board must be inserted into one of the connector plugs of the backplane assembly. It then is difficult, if not impossible, to align the plug-in portion of the board with the connector plug for proper insertion of the board into the plug unless the support shelves have facilities for accurately aligning both the upper and lower edges of the board with the connector plug.

In the past, the support shelves for the printed circuit boards have been fabricated in various manners, including die casting, plastic molding and metal fabricating. For example, the U.S. Pat. No. 3,731,157 to W. A. Reimer discloses a support shelf stamped as a unitary structure from a single sheet of stock material. The shelf includes a plurality of spaced upper channels for receiving lower edges of printed circuit boards, and a plurality of spaced lower alignment notches formed in vertical alignment with respective ones of the upper channels, for receiving upper edges of printed circuit boards. The shelves are arranged in a vertically spaced relationship such that the upper channels of one shelf cooperate with the lower alignment notches of an adjacent shelf thereabove to receive and align printed circuit boards therebetween.

SUMMARY OF INVENTION

This invention is directed to a support shelf which is particularly adapted for supporting a plurality of closely spaced printed circuit boards and for aligning the boards with connector plugs of a backplane assembly. In general, the support shelf includes at least one planar sheet-like support section having a plurality of elongated parallel guide channels for receiving lower edges of printed circuit boards supported thereon. A planar sheet-like guide section, connected by a wall portion to the planar support section, extends parallel to the planar support section and also includes a plurality of elongated parallel guide channels for receiving upper edges of printed circuit boards supported by an adjacent lower shelf. The guide channels of the planar support section are defined by pairs of opposed ribs projecting out of the plane of the support section in a first direction away from the planar guide section. Similarly, the guide channels of the planar guide section are defined by pairs of opposed ribs projecting out of the plane of the planar guide section in a second opposite direction away from the planar support section. Preferably, the opposed ribs of each guide channel have diverging arcuate side surfaces and arcuate upper edges which define smooth flared end sections on at least one end of each channel. The shelves also are preferably formed with smooth board engaging-surfaces, including the flared end sections of the channels, to facilitate insertion and retraction of the boards into and out of the backplane assembly without scratching or marring of the surfaces of the boards.

More particularly, the support shelf is of unitary sheet metal construction and includes, in addition to the one support section and the one guide section, a second support section interconnected to the one support section by one or more reinforced strap members extending therebetween, and a second guide section connected to the second support section by a wall portion. The second support section and the second guide section are arranged in the plane of and spaced from the first support section and the first guide section, respectively, defining an open space therebetween. The second support section includes a plurality of guide channels identical in configuration to the guide channels of the first support section and which are longitudinally aligned with the guide channels of the first support section. Similarly, the second guide section includes a plurality of guide channels identical in configuration to the guide channels of the first guide section, which are longitudinally aligned with the guide channels of the first guide section. A cover member having notches aligned with selected guide channels of the support section and selected guide channels of the guide section may be secured to the wall portion of the shelf to permit access to selected channels while precluding access to other channels. The shelf further includes mounting brackets with resilient protrusions formed therein to facilitate alignment of the shelf in associated apparatus.

BRIEF DESCRIPTION OF THE DRAWINGS

FIG. 2 is an enlarged isometric view of a portion of an upper side of a support shelf of the shelf assembly of FIG. 1;

FIG. 3 is an isometric view showing a portion of an underside of the shelf in FIG. 2;

DETAILED DESCRIPTION

Figure 1:
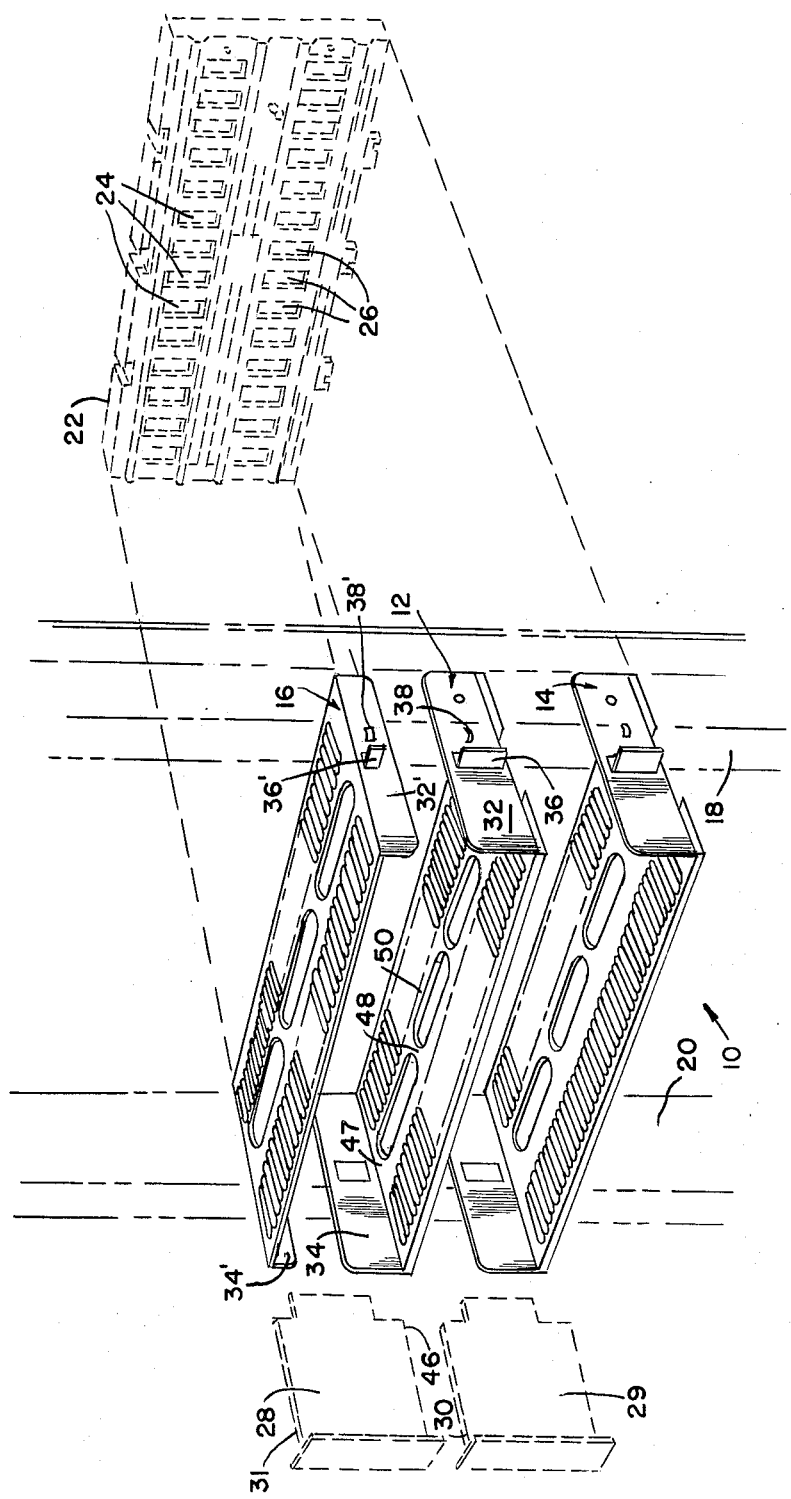
FIG. 1 is an isometric view of a transmission bay module showing a support shelf assembly in accordance with this invention.

Referring to FIG. 1, a transmission bay module 10 includes upper and lower support shelves 12 and 14 and a top cover plate 16 secured by suitable screws to a pair of vertically extending frame members 18 and 20. The transmission bay module 10 also includes a backplane assembly 22 which comprises upper and lower sets of connector plugs 24 and 26 and which is secured to the shelves 12 and 14, the top cover 16 and the frame members 18 amd 20 by suitable screws. The backplane assembly 22 may be of a type as described in the copending application Ser. No. 130,497 filed on Mar. 14, 1980, in the names of J. O. Etchison, Jr. and R. H. W. Jones, Jr. and entitled "Unitary Molded Connector Plug Support Member," the disclosure of which is hereby incorporated by reference.

This invention is directed to the support shelves 12 and 14 of the transition bay module 10, which are provided to facilitate the insertion of a plurality of printed circuit boards 28 and 29 (two shown) into the upper and lower connector plugs 24 and 26 of the backplane assembly 22 in a relatively closely-spaced relationship (e.g., ½ inch centers). The upper shelf 12 supports printed circuit boards 28 and also guides upper edges 30 of the printed circuit boards 29 supported on the lower shelf 14. Further, upper edges 31 of the printed circuit boards 28 on the upper shelf 12 are guided by the top cover 16. Since the support shelves 12 and 14 are of identical construction so as to be interchangeable, only the upper shelf will be described herein.

The upper shelf 12 is fabricated from a unitary sheet of metal and includes a pair of vertically extending planar brackets 32 and 34 for supporting the shelf on the vertical frame members 18 and 20. Mounting tabs 36 (one shown) also extend perpendicularly from the support brackets 32 and 34 for securing the shelf to the vertical frame members 18 and 20. Spring biased protrusions 38 (one shown) are formed out of the plane of the support brackets 32 and 34 from the metal thereof. The protrusions 38 engage and are biased against respective vertical faces of the frame members 18 and 20 when the support shelf 12 is positioned between the frame members and are provided to permit the shelf to be shifted laterally a slight distance as necessary between the frame members to insure proper vertical alignment of the upper and lower shelves 12 and 14 and the cover plate 16.

As is best shown in FIG. 2, the support shelf 12 further includes spaced front and rear support sections 40 and 42 for supporting the printed circuit boards 28 thereon and having upper guide channels 44 protruding from the surface of the front and rear support sections for slidably receiving lower edges 46 (FIG. 1) of the printed circuit boards. The upper guide channels 44 of the front support section 40 are longitudinally aligned with the upper guide channels 44 of the rear support section 42. The front and rear support sections 40 and 42 are interconnected by intergrally formed end sections 47 (FIG. 1) and rigid strap members 48 extending across an intermediate shelf portion 50, which is of open construction to facilitate air circulation between the closely-spaced printed circuit boards 28 and 29. A plurality of continuous depending lips 52 are formed along inward edges 54 of the front support section 40, the end sections 47 (FIG. 1), on opposite sides of the strap members 48, and along inward edges 56 of the rear support section 42, to provide reinforcement for the intermediate portion 50 of the shelf 12, thereby inhibiting sagging of the shelf at the intermediate portion when the closely-spaced metal printed circuit boards 28 are supported on the shelf.

As is best shown in FIG. 3, a front lower guide section 60 of the upper support shelf 12, having lower guide channels 62, for guiding the upper edges 30 (FIG. 1) of the printed circuit boards 29 supported on the lower shelf 14, extends parallel to the front support section 40 and is integrally connected thereto by a vertically extending front wall 64. Similarly, a rear lower guide section 66, also having lower guide channels 62 formed thereon for guiding the upper edges 30 of the printed circuit boards 29 supported on the lower shelf 14, extends parallel to the rear support section 42 and is integrally connected thereto by a vertically extending rear wall 68. Respective ones of the lower guide channels 62 in the front and rear lower guide sections 60 and 66 are longitudinally aligned with one another and the upper guide channels 44 in the front and rear upper support sections 40 and 42. The front and rear lower guide sections 60 and 66, as in the case of the front and rear upper support sections 40 and 42, also are spaced apart to facilitate air circulation between the closely-spaced printed circuit boards 28 and 29. The vertically extending rear wall 68 is formed with depending (upwardly projecting in FIG. 3) screw-threaded tabs 70 (one shown) for securing the shelf 12 to the backplane assembly 22.

Figure 4:
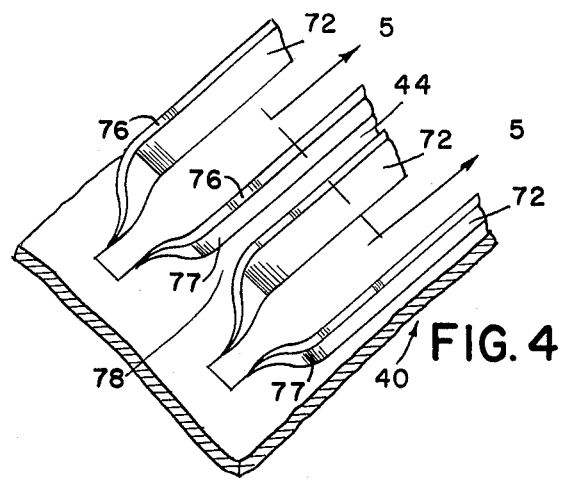
FIG. 4 is a further enlarged isometric view showing portions of upper guide channels of the shelf as shown in FIG. 2.
Figure 5:
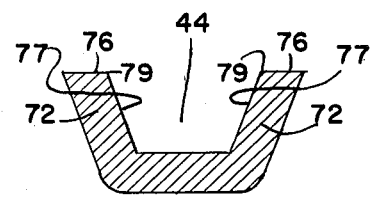
FIG. 5 is a cross sectional view taken along the line 5—5 of FIG. 4.

Referring again to FIG. 2 and to FIGS. 4 and 5, the upper guide channels 44 of both the front and rear support sections 40 and 42 are defined by pairs of opposed upwardly extending ribs 72 formed out of the plane of the front and rear support sections so as to project therefrom in a direction away from the front and rear lower guide sections 60 and 66. The ribs 72 of each channel 44 have upper edge portions 76 and opposed side surfaces 77, the upper edge portions curving downward at opposite ends of the channel and the opposed side surfaces diverging at the opposite ends of the channel, to define flared end sections 78 which facilitate the insertion and removal of the printed circuit boards 28 and 29 into and out of the channels, particularly if the boards have become warped. The upper edge portions 76 of the ribs 72 are of a smooth-surfaced burr-free construction, at least along inward edges 79 (FIG. 5) thereof adjacent the channels 44. Accordingly, the opposed arcuate side surfaces 77 of the ribs 72 at the flared end sections 78 also are burr-free and present no sharp corners which could damage the printed circuit boards 28 and 29 as they are inserted into and removed from the channels.

Figure 6:
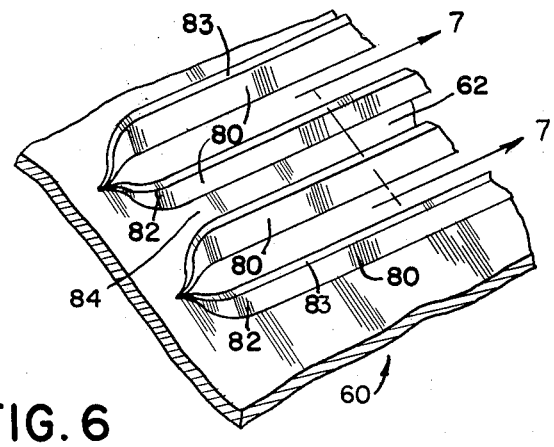
FIG. 6 is a further enlarged isometric view showing portions of lower guide channels of the shelf as shown in FIG. 3.
Figure 7:
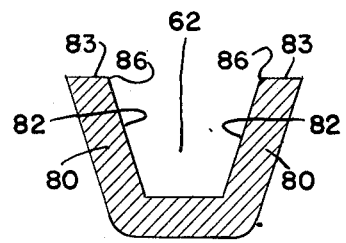
FIG. 7 is a cross-sectional view taken along the line 7—7 of FIG. 6.

Similarly, the lower guide channels 62 (FIGS. 3, 6 and 7) of the front and rear lower guide sections 60 and 66 are defined by pairs of opposed ribs 80 projecting from the plane of the front and rear lower guide sections in a direction away from the front and rear upper support sections 40 and 42. The ribs 80 have side surfaces 82 which diverge at opposite ends of the channels 62 and upper edges 83 which curve downwardly at opposite ends of the channels, to define flared end sections 84. The upper edges 85 of the ribs 80 also are of a smooth-surface burr-free construction, at least along inward edges 86 thereof adjacent the channels 62. The ribs 80 of the lower guide channels 62 are similar in construction to the ribs 72 of the upper support sections 40 and 42, but slightly greater in depth to help insure proper reception of the upper edges 30 of the printed circuit boards 29 supported on the lower shelf 14, between the ribs.

The closely-spaced upper and lower guide channels 44 and 62, respectively, in addition to accommodating the printed circuit boards 28 and 29 in closely-spaced relationship, produce a ribbed shelf construction of high strength which is resistant to flexing. Further, the openings between the ribs 72 and 80 of the upper and lower channels 44 and 62, together with the space between the front and rear upper support sections 40 and 42 and the space between the front and rear lower guide sections 60 and 66, produce a "chimney" effect when the shelves 12 and 14 are mounted in a transmission bay, to facilitate air circulation between and cooling of the closely-spaced printed circuit boards 28 and 29.

Referring to FIG. 1, the top cover plate 16 is essentially identical in construction to one of the support shelves 12 or 14 from which the lower front and rear guide sections 60 and 66 have been removed, and which has been mounted between the bay frame members 18 and 20 in an inverted position. In this regard, by way of illustration, the top cover plate 16 includes guide channels (not shown) formed by downwardly projecting ribs (not shown) identical to the channel-defining ribs 72 of the support shelf 12, mounting brackets 32' and 34' similar to the shelf mounting brackets 32 and 34, bracket mounting tabs 36' and resilient bracket protrusions 38'.

To insert one of the printed circuit boards 28 into an associated one of the connector plugs 24 of the backplane assembly 22, a lower leading edge portion of the board is first positioned on the planar surface of the front support section 40 of the shelf 12 and into the flared end section 78 of one of the front upper guide channels 44, while simultaneously an upper leading edge portion of the board is positioned into the corresponding flared end section (not shown) of one of the front guide channels (not shown) of the top cover 16. The printed circuit board 28 is then pushed along the front guide channel 44 and its aligned rear guide channel 44 of the upper shelf 12, and along the front guide channel (not shown) and its aligned rear guide channel of the top cover 16, to insert the board into the selected connector plug 24 of the backplane assembly 22. During this insertion process, even if the printed circuit boards 28 is warped, the lower and upper edges 46 and 31 of the board, respectively, are captured by the guide channels 44 of the upper shelf 12 and the guide channels (not shown) of the top cover 16, thereby accurately aligning and orienting the board for proper insertion into the connector plug 24 without scratching, marring or otherwise damaging the board. When the printed board 28 is fully inserted into the connector plug 24 of the backplane assembly 22, a spring biased latch (not shown) on the printed circuit board engages in a rectangular notch 87 (FIG. 2) formed adjacent the front upper channel 44 to lock the board in place in the connector plug.

When only selected ones of the channels 44 and 62 of the shelf 12 are to have associated printed circuit boards 28 and 29 mounted therein, such as when the boards are to be on center-to-center spacings greater than that of the channels, a cover member 89 (shown in phantom in FIG. 2) may be removably secured to the front wall 64 of the upper shelf 12 and similar cover members may be secured to the lower shelf 14 and the top cover 16. The cover member 89 conforms generally to the configuration of the front wall 64 and includes a plurality of upper and lower notches 89a and 89b formed therein, and aligned with selected ones of the upper and lower channels 44 and 62 which are to receive the printed circuit boards 28 and 29, respectively. Accordingly, when the cover member 89 is secured to the front wall 64 of the upper shelf 12 and the abovementioned cover members are secured to the lower shelf 14 and the top cover 16, the printed circuit boards 28 and 29 can only be inserted into the upper and lower channels 44 and 62 which are aligned with the notches 89a and 89b since the unnotched portions of the cover member preclude access to the upper and lower channels behind the unnotched portions.

Figure 8:
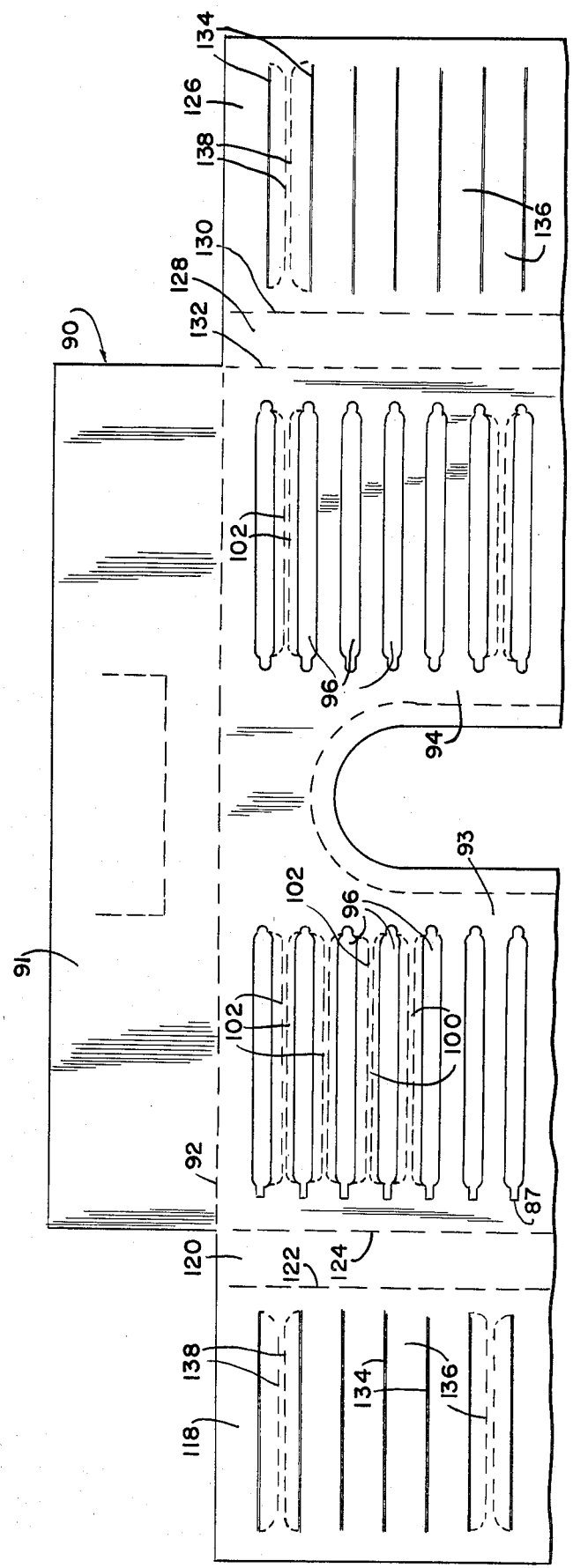
FIG. 8 is a top view of a shelf blank in an intermediate phase of the forming of the shelf shown in FIGS. 2 and 3.

Referring to FIG. 8, a shelf blank 90 is illustrated in an intermediate stage in the fabrication of the completed shelf 12 as viewed in FIGS. 1 and 2. The shelf blank 90 includes laterally projecting side sections 91 (one shown) which subsequently are bent along bend lines 92 to form the brackets 32 and 34 of the completed shelf 12. First and second inward sections 93 and 94, which will ultimately form the front and rear support sections 40 and 42 of the completed shelf 12, respectively, as viewed in FIG. 2, have respective rows of slots 96 formed therethrough. The slots 96 in the first inward section 93 of the blank 90 includes the square notches 87 formed at their front ends for subsequently receiving the latching fingers (not shown) on the printed circuit boards 28. The slots 96 define a plurality of first strips 100 which, when bent upwardly along bend lines 102, form the ribs 72 of the upper channels 44.

Figure 9:
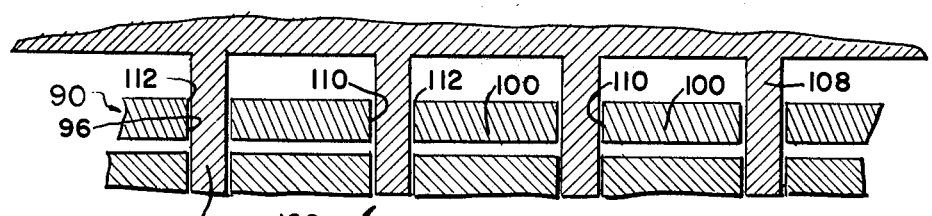
FIG. 9 is a schematic representation depicting a step in the forming of first portions of the shelf blank in FIG. 8.
Figure 10:
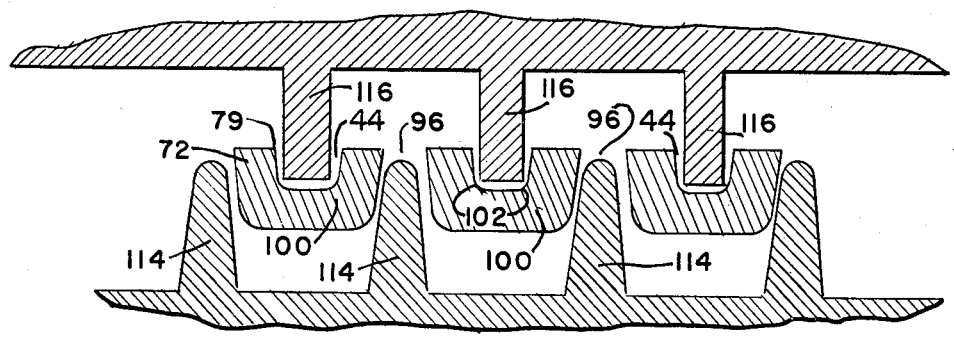
FIG. 10 is a schematic representation depicting a step subsequent to the step in FIG. 9 in the forming of the first portions of the shelf blank.

In forming the upper channels 44, the first and second inward sections 93 and 94 of the blank 90 may be positioned in a suitable punch and die mechanism 106 as illustrated schematically in FIG. 9, wherein a plurality of punch members 108 shear through the blank 90 from the top side thereof to form the plurality of slots 96 and define the plurality of interconnected first strips 100 therebetween. In this shearing process, sheared edges 110 of the first strips 100 are inherently formed to be of essentially smooth burr-free construction, particularly along upper corners 112 thereof. The first strips 100 are subsequently folded upwardly as shown in FIG. 10 in a suitable die forming operation in which lower die members 114 move upwardly through the slots 96 and cooperate with upper die members 116 to bend the strips along the bend lines 102 to form the ribs 72 of the upper channels 44, wherein the smooth upper corners 112 of the strips 100 define the inward edges 79 of the channels. The flared end sections 78 (FIG. 2) of the upper channels 44 also are inherently formed at opposite ends thereof during the forming of the channels.

Referring again to FIG. 8, the blank 90 further includes a first end section 118 and a first intermediate section 120, which when bent along bend lines 122 and 124, respectively, will form the front lower guide section 60 and the front wall 64, of the completed shelf 12. Similarly, a second end section 126 and a second intermediate section 128, when bent along bend lines 130 and 132, respectively, will form the rear lower guide section 66 and the rear wall 68, respectively, of the completed shelf 12. The first and second end sections 118 and 126 each includes a row of slits 134 formed therethrough and defining a plurality of second strips 136 which, when bent upwardly along bend lines 138, form the ribs 80 of the lower channels 62 of the front and rear lower guide sections 60 and 66.

Figure 11:
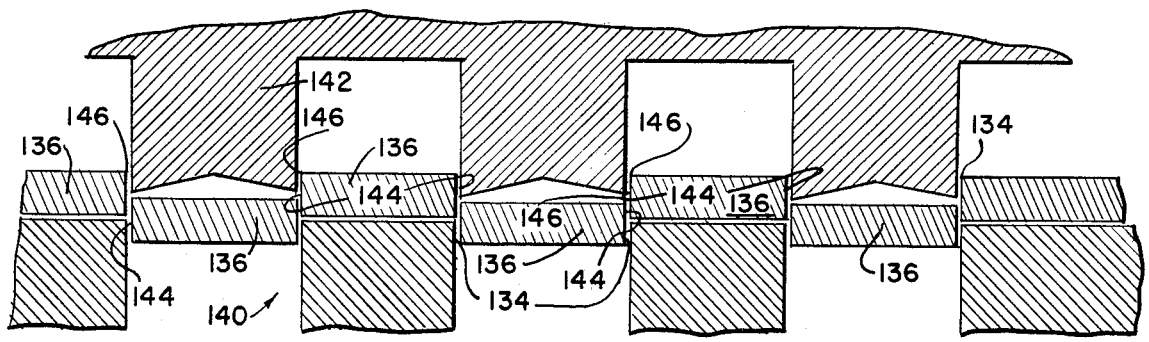
FIG. 11 is a schematic representation depicting a step in forming second portions of the shelf blank in FIG. 8.

To form the lower channels 62, the first and second end sections 118 and 126 of the blank 90 may be first positioned into a suitable punch and die mechanism 140, as illustrated schematically in FIG. 11, wherein a plurality of die members 142 shear the blank from the upper side thereof, forming the second strips 136, while causing alternate ones of the strips to be depressed relative to the other strips. In this shearing process, sheared edges 144 of the second strips 136 are inherently formed with smooth burr-free corners 146.

Figure 12:
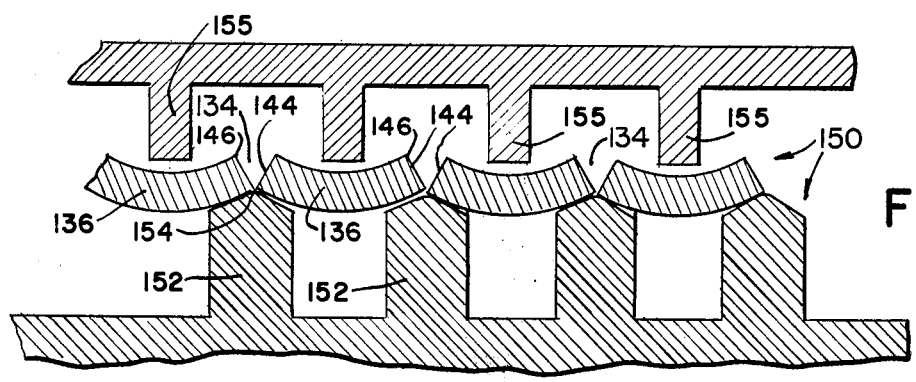
FIG. 12 is a schematic representation depicting a step subsequent to the step of FIG. 11 in the forming of the second portions of the shelf blank in FIG. 8.

After the slits 134 and the second strips 136 have been formed in the first and second end sections 118 and 126, the blank 90 may be positioned in a second die mechanism 150 as illustrated in FIG. 12, wherein lower die members 152 coin lower corners 154 of the strips 136 to remove any burrs or sharp edges remaining on these edges as a result of the slitting operation. At the same time the die members 152, in cooperation with opposing upper die members 155, perform an initial bending operation on the strips 136 while moving central portions of the strips 136 back into essentially coplanar relationship. Subsequently, the strips 136 are bent upwardly along the bend lines 138 (FIG. 8) in a die forming operation similar to that illustrated in FIG. 10, in which lower die members (not shown) are moved upwardly through the slits 134 to form the ribs 80 of the lower channels 62, including the flared end sections 84, with the smooth burr-free upper corners 146 (FIG. 11) defining the inward edges 86 (FIG. 7) of the lower channels 62. In this regard, as a result of slitting the first and second end sections 118 and 126 of the blank 90 in the fabrication of the ribs 80 of the lower channels 62, rather than removing material to form slots therein, such as the slots 96 formed in the fabrication of the ribs 72 of the upper channels 44, the ribs of the lower channels are of greater depth to insure proper reception of the upper edges 30 of the printed circuit boards 29 therein as above-described.

The initial forming of the shelf blank 90 and the subsequent forming of the ribs 72 and 80 of the upper and lower guide channels 44 and 62, respectively, as above described, may be accomplished in various independent fabricating stations, or in successive stations of a progressive punch-and-die in a manner known to those skilled in the art. Similarly, the various additional bending and forming operations required to form the brackets 32, 34, mounting tabs 36, resilient protrusions 38, reinforcing lips 52, lower guide sections 60, 66, vertical walls 64, 68 and mounting tabs 70, to complete the shelf 12, may be accomplished in suitable fabricating stations in a known manner, and therefore are not shown.

In summary, the unitary support shelves 12 and 14 are of an inexpensive, readily fabricated construction which has high strength for supporting the plurality of printed circuit boards 28 and 29 in the transmission bay module 10 in a closely-spaced relationship and which facilitates insertion and retraction of the boards into and out of the upper and lower connector plugs 24 and 26 of the backplane assembly 22 without damage to the boards, even when the boards have become warped. By way of example, the upper channels 44 of the upper shelf 12, which are provided for receiving the lower edges 46 of the printed circuit boards 28 supported on the upper shelf, and the lower channels 62 of the shelf, which are provided for receiving the upper edges 30 of the circuit boards 29 supported on the lower shelf 14, are fabricated with smooth board engaging surfaces, including the flared end sections 78 and 84, respectively, and the smooth inward edges 79 and 86, respectively, to prevent the scratching or marring of the surfaces of the printed circuit boards during insertion and retraction of the boards into and out of the backplane assembly 22.

In addition, by way of illustration, the ribs 72 and 80, which define the upper and lower channels 44 and 62, respectively, of the support shelf 12, also project from the plane of the front and rear support sections 40 and 42 and the plane of the front and rear guide sections 60 and 66, to provide a ribbed construction which makes the front and rear support sections and the front and rear guide sections highly resistive to flexing. The continuous lips 52 formed along the inward edges 54 of the front support section 40, the inward edges 56 of the rear support section 42, the end sections 47 and opposite sides of the strap members 48, provide additional reinforcement for the open intermediate section 50. The openings between the channels 44 and 62, the open intermediate section 50 and the space between the front and rear lower guide sections 60 and 66, also cooperate to produce a "chimney effect" when the shelves 12 and 14, and the top cover plates 16, are mounted in a transmission bay, to facilitate air circulation between and cooling of the closely-spaced printed circuit boards 28 and 29. Further, the resilient protrusions 38 on the brackets 32 and 34 of the shelves 12 and 14, and the resilient protrusions 38' on the top cover plates 16, facilitate proper alignment of the shelves and the top cover plates in the transmission bay. In addition, the slotted front cover members 89 (or modifications thereof) can be used on the shelves 12 and 14 and the top cover plates 16, as desired, to facilitate insertion of the printed circuit boards 28 and 29 into the guide channels 44 and 62 of the shelves 12 and 14, and the guide channels (not shown) of the top cover plates 16, on a selective basis.

What is claimed is:

1. A support shelf which comprises:
   a first planar sheet-like support section having a plurality of elongated parallel guide channels defined by opposed parallel ribs projecting out of the plane of said support section;
   at least one planar sheet-like guide section extending parallel to said first planar support section and having a plurality of elongated parallel guide channels defined by opposed parallel ribs projecting out of the plane of said guide section, the opposed parallel ribs of said first support section projecting in a first direction away from said guide section and the opposed parallel ribs of said guide section projecting in second direction away from said first support section;
   a wall interconnecting said first planar support section and said planar guide section;
   a second planar sheet-like support section arranged in the plane of and spaced from said first support section to define an opening therebetween, said second planar support section having a plurality of elongated parallel guide channels defined by opposed ribs projecting out of the plane of said second support section in the same direction as the ribs of said first support section, and the elongated guide channels of said second support section being longitudinally aligned with respective ones of the elongated guide channels of said first support section; and
   rigid means extending between said first and second support sections for interconnecting said first and second support sections.

2. A support shelf as recited in claim 1, wherein said opposed ribs of each guide channel have diverging arcuate side surfaces and arcuate upper edges at least at one end of each channel, to define flared end sections.

3. A support shelf as recited in claim 1 wherein said planar guide section is a first guide section and which further comprises:
   a second planar sheet-like guide section extending parallel to said second planar support section and having a plurality of elongated parallel guide channels defined by opposed parallel ribs projecting out of the plane of said second guide section and away from said second support section, the guide channels of said second guide section being longitudinally aligned with respective ones of the guide channels of said first guide section; and
   a wall interconnecting said second planar support section and said second planar guide section.

4. A support shelf as recited in claim 3, wherein the shelf is of unitary sheet metal construction.

5. A support shelf as recited in claim 1, wherein:
   said rigid means interconnecting said first and second support sections includes at least one intermediate strap member disposed between opposite ends of said support sections; and
   continuous reinforcing lips are formed on inward edges of said first and second support sections and on opposite sides of said strap member.

6. A support shelf as recited in claim 1 which further comprises:
   mounting brackets at opposite sides of said planar support section and extending from the plane of said support section essentially perpendicularly thereto, each of said mounting brackets including an outwardly projecting resilient protrusion formed from said mounting bracket.

7. A support shelf which comprises:
   at least one planar sheet-like support section having a plurality of elongated parallel guide channels defined by opposed parallel ribs projecting out of the plane of said support section;
   at least one planar sheet-like guide section extending parallel to said planar support section and having a plurality of elongated parallel guide channels defined by opposed parallel ribs projecting out of the plane of said guide section, the opposed parallel ribs of said support section projecting in a first direction away from said guide section and the opposed parallel ribs of said guide section projecting in a second direction away from said support section;
   a wall interconnecting said planar support section and said planar guide section; and
   a cover member secured to the wall interconnecting said planar support section and said planar guide section, said cover member being formed with a plurality of notches aligned with selected guide channels of said support section and selected guide channels of said guide section for permitting access to the selected channels while precluding access to the other channels.

* * * * *

UNITED STATES PATENT AND TRADEMARK OFFICE
CERTIFICATE OF CORRECTION

PATENT NO. : 4,353,469
DATED : October 12, 1982
INVENTOR(S) : John O. Etchison, Jr., Robert H. W. Jones, Jr., Jean Thomas It is certified that error appears in the above-identified patent and that said Letters Patent are hereby corrected as shown below:

On the title page of the patent, left-hand Column, the listing of the inventors should read:

--[75] Inventors: John O. Etchison, Jr., Clemmons;
Robert H. W. Jones, Jr., Greensboro;
Jean Thomas, Winston-Salem,
all of North Carolina.--

Column 4, line 44, "intergrally" should read --integrally--. Column 6, line 29, "boards" should read --board--.

Signed and Sealed this

First Day of March 1983

[SEAL]

Attest:

GERALD J. MOSSINGHOFF

Attesting Officer    Commissioner of Patents and Trademarks